United States Patent [19]

Okano

[11] 4,430,152

[45] Feb. 7, 1984

[54] PROCESS FOR FABRICATING A SEMICONDUCTOR DEVICE

[75] Inventor: Takashi Okano, Tokyo, Japan

[73] Assignee: Fujitsu Limited, Kawasaki, Japan

[21] Appl. No.: 435,746

[22] Filed: Oct. 21, 1982

[30] Foreign Application Priority Data

Oct. 23, 1981 [JP] Japan ................................ 56-169766

[51] Int. Cl.³ ....................... B44C 1/22; C03C 15/00; C03C 25/06
[52] U.S. Cl. ........................................ 156/643; 134/2; 134/39; 156/646; 156/651; 156/657; 156/663; 204/192 E; 252/79.1; 252/79.5
[58] Field of Search ................ 156/643, 646, 650–653, 156/655, 657, 659.1, 662, 663, 665; 252/79.1, 79.5; 134/2, 29, 39, 42; 204/192 E; 427/90

[56] References Cited

U.S. PATENT DOCUMENTS 4,354,897 10/1982 Nakajima ........................ 156/651 X

FOREIGN PATENT DOCUMENTS 54-18279 2/1979 Japan ................................... 156/651

Primary Examiner—William A. Powell
Attorney, Agent, or Firm—Staas & Halsey

[57] ABSTRACT

A metal layer exposed by dry etching a phosphosilicate glass (PSG) layer covering the metal layer is insufficiently reliable when an electrical connection is made by bonding wire to the metal layer or depositing another metal layer on the metal layer. This insufficiency is due to the presence of a phosphorous residue on the surface of the exposed metal layer. The phosphorous residue is preferably removed by treating the surface of the metal layer with an alkaline solution so that the PSG layer, the metal layer, and the semiconductor device in which the connection is made are not affected.

8 Claims, 4 Drawing Figures

PROCESS FOR FABRICATING A SEMICONDUCTOR DEVICE

BACKGROUND OF THE INVENTION

The present invention relates to a process for fabricating a semiconductor device. In particular, it relates to treatment of the surface of a metal layer exposed by dry etching part of a phosphosilicate glass (PSG) layer covering the metal layer, the exposed metal layer being used for an electrical connection.

Many semiconductor devices having various types of circuit elements formed in a semiconductor substrate, include a metal interconnection layer which connects an impurity doped layer, a gate electrode, or another component in the substrate, to the exterior of the substrate or to another circuit element in the substrate. Such a metal interconnection layer is often covered with a PSG layer as a protective layer or an insulating layer between metal layers. Such a PSG layer covering a metal layer is partly removed by etching so as to expose the underlying metal layer and to form a connection between the exposed area of the metal layer and the exterior or another circuit element of the substrate.

Recently, dry etching processes such as parallel plane-type plasma etching, ion beam etching, sputter etching, and so on have been used for etching PSG layers in order to increase the processing precision, simplify the treatment, or accomplish other purposes. However, a metal layer exposed by dry etching a PSG layer covering the metal layer may result in an insufficient electrical connection or may increase the contact resistance when a wire is bonded onto it or a connection is made to it. If such an exposed metal surface is used as an electrode pad for wire bonding, the metal of the wire does not sufficiently alloy with the metal of the pad, sometimes resulting in separation of the wire from the pad. If a second metal layer is deposited on an insulating PSG layer covering a first metal layer, as well as in a through hole formed by dry etching part of the PSG layer, i.e., the exposed area of the first metal layer, the contact between the two metal layers may not be electrically sufficient and may result in a disconnection with the passage of time.

It has been proposed to treat the surface of a metal layer with a hydrofluoric acid solution, etc. after exposing by dry etching a silicon dioxide ($SiO_2$) layer covering the metal layer. However, this method is not very effective and, in addition, concerns a $SiO_2$ layer, not a PSG layer.

SUMMARY OF THE INVENTION

It is, therefore, an object of the present invention to provide excellent wire bondings and connections by way of a through hole at the surface of a metal layer exposed by dry etching a PSG layer covering the metal layer.

This and other objects, features, and advantages of the present invention are accomplished by a process for fabricating a semiconductor device, comprising the steps of: forming a metal layer on a semiconductor substrate; forming a PSG layer on the metal layer; dry etching part of the PSG layer on the metal layer to expose at least part of the metal layer; and treating the exposed surface of the metal layer with an alkaline solution.

The present invention was made on the basis of the discovery by the inventor that after a metal layer is exposed by dry etching a PSG layer covering the metal layer, a phosphorous residue remains on the surface of the metal layer. An excellent electrical connection at the surface of the metal layer exposed by dry etching a PSG layer covering the metal layer can be made by removing the phosphorous residue from the surface of the metal layer. For example, in the case of reactive ion etching using fluoroform ($CHF_3$), a phosphorous residue is formed in the manner described below. The etching process is carried out by decomposing a PSG layer into silicon tetrafluoride ($SiF_4$), oxygen ($O_2$), and a phosphorous-containing substance whose chemical formula is not certain, all of the substances flying out of a workpiece to be etched. When the phosphorous flies out of the workpiece, it flies into a plasma atmosphere surrounding the workpiece, the atmosphere ions being directed toward the workpiece. As a result, the phosphorous is changed into plasma and is forced back toward the workpiece, and, consequently, a phosphorous residue is formed on the surface of the workpiece. The phosphorous residue includes not only phosphorous but also a small amount of carbon, fluorine, etc. The formation of a phosphorous residue on a metal layer by etching a PSG layer covering the metal layer occurs in the case of dry etching, for example, parallel plane-type plasma etching, ion etching, or sputter etching.

Although the phosphorus residue can be removed, for example, by treating it with an acid or hydrogen peroxide, such processes are not suitable for practical application since a large part of the metal layer is also removed simultaneously with the removal of the phosphorous residue due to the corrosive properties of the metal, such as aluminum. Thus, an alkaline solution should be used, in accordance with the present invention, to remove the phosphorous residue from the metal layer. Alkalis such as ammonia; organic amines, for example, diethylamine ($Et_2NH$), triethylamine ($Et_3N$), dimethylamine ($Me_2NH$), trimethylamine ($Me_3N$), buthylamine ($H_2N.C_3H_7$), choline $[HOCH_2CH_2N^+(CH_3)_3]OH^-$; and salts of organic amines, for example, diethylamine hydrochloride ($Et_2N^+H_2Cl^-$), triethylamine hydrochloride ($Et_3N^+HCHl^-$), trimethylamine hydrochloride ($Me_3N^+HCl^-$), buthylamine hydrochloride ($H_2N^+.C_3H_7HCl^-$), are preferably used in the process of the present invention. Hydroxides of an alkali metal, such as sodium hydroxide and potassium hydroxide, and hydroxides of an alkali earth metal, such as calcium hydroxide, may also be used to remove the phosphorous residue from the metal layer. However, these hydroxides are disadvantageous since solutions of them may cause contamination of a semiconductor device, as is known.

Metals which can be advantageously used in the process of the present invention include aluminum, aluminum-based alloy, molybdenum, molybdenum-based alloy, tungsten, tungsten-based alloy, titanium, titanium-based alloy, niobium, and niobium-based alloy.

BRIEF DESCRIPTION OF THE DRAWINGS

These and other objects, features, and advantages of the present invention are more fully described with reference to the accompanying drawings, in which.

DESCRIPTION OF THE PREFERRED EMBODIMENT

Figure 1:
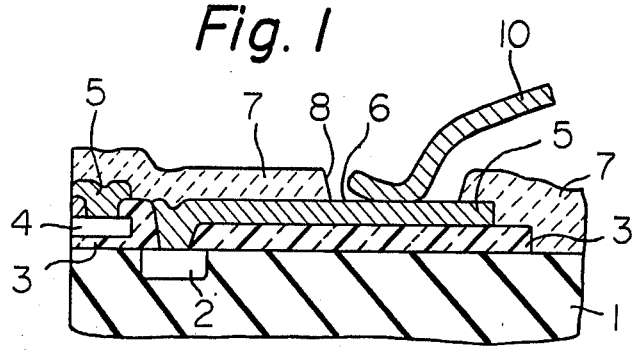
FIG. 1 is a sectional view of a semiconductor device where a wire is bonded onto an electrode pad.

FIG. 1 is an example of a semiconductor device including a metal-oxide semiconductor field-effect transistor and a wire bonding. In a silicon substrate 1, a source or drain 2 was formed by diffusion and the surface of the substrate 1 was covered with a silicon dioxide film 3 on which a gate 4 was formed. Then an aluminum layer 5 having a thickness of approximately 1 μm was deposited on the silicon dioxide film 3 and was patterned for use as an interconnection line including a portion of an electrode pad 6. PSG layer 7 having a thickness of approximately 1–2 μm formed as protective layer to cover the aluminum layer 5 and a 100 μm × 100 μm opening 8 was made on the electrode pad 6 by dry etching. The dry etching in this example was reactive ion etching in which the reactive gas was CHF$_3$ and the pressure was 0.2 Torr. By carrying out dry etching, the PSG layer 7 was precisely etched, resulting in the formation of the precise opening 8.

Figure 2:
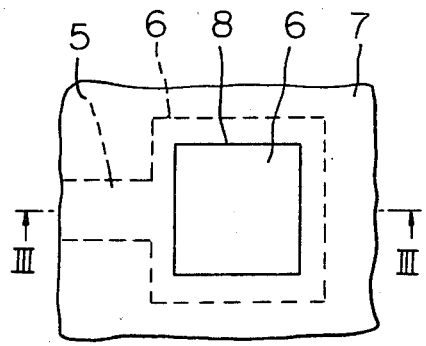
FIG. 2 is a plan view of a portion of the electrode pad in FIG. 1.
Figure 3:
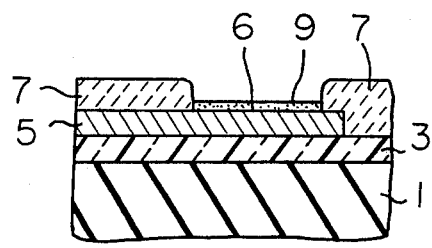
FIG. 3 is a sectional view taken along the line III—III in FIG. 2.

A plan view of a portion of the electrode pad 6 at this stage, i.e., after dry etching, is shown in FIG. 2, and a sectional view of the electrode pad 6 taken along the line III—III in FIG. 2 is shown in FIG. 3. After the reactive ion etching, a phosphorous residue 9 remained in the opening 8 and on the surface of the electrode pad 6. The presence of the phosphorous residue 9 was confirmed by carrying out Auger analysis on a portion of the electrode pad 6. The amount of phosphorous residue on the surface of the electrode pad 6 was about 10 to 17 times that on the surface of an electrode pad fabricated in a manner similar to the above example but in which wet etching was carried out instead of dry etching. The surface of the electrode pad 6 was then cleaned by dipping the silicon wafer in a 3.5 wt% aqueous solution of ammonia at a room temperature of about 22° C.–23° C. for about 30 seconds. The phosphorous residue was removed from the surface of the electrode pad 6, for example, according to the following chemical reaction:

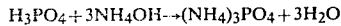

$H_3PO_4 + 3NH_4OH \rightarrow (NH_4)_3PO_4 + 3H_2O$

The etching rate of aluminum when an ammonia solution is used is slow, about 50 Å per minute. Thus, the electrode pad 6 having a thickness of 1 μm was not affected by the above-mentioned short dipping time.

After the removal of the phosphorous residue from the surface of the electrode pad 6, a gold wire 10 was bonded onto the pad 6. The gold wire 10 alloyed well with the aluminum electrode pad 6, creating a highly reliable electrical connection between the gold wire 10 and the pad 6.

To ascertain the effect of the present invention, the purple plague test was carried out. The purple plague test was conducted by depositing a 1500 Å-thick gold layer on the aluminum electrode pad 6 and annealing the gold layer and the pad 6 at 350° C. for 15 minutes.

According to the purple plague test, if the gold alloys with the aluminum, the gold will change to a purple color, indicating the formation of a gold-aluminum alloy. In the present test, the entire aluminum electrode pad 6, which was cleaned with an ammonia solution according to the present invention, turned purple in all the samples while only a small portion of an aluminum electrode pad similar to the pad 6 but not having been cleaned with an ammonia solution turned purple, i.e., about one tenth of the pad turned purple. Further, an aluminum electrode pad similar to the pad 6 but which was treated with a hydrofluoric acid solution instead of an ammonia solution did not change color at all. These results indicate that an excellent and reliable connection can be made between an electrode pad, comprising aluminum or another metal and being cleaned with an ammonia solution, and a wire comprising gold or another metal.

In addition to the purple plague test, the phosphorous content of various electrode pads was determined by means of Auger analysis. Auger analysis, however, reveals the relative amount of phosphorous, not the absolute amount. In the following analysis, the resultant amounts of phosphorous are expressed as a relative value on the basis of an assumed reference amount.

In the Auger analysis, first, a PSG layer covering the surface of an aluminum layer was wet etched with a aqueous hydrofluoric acid solution. Phosphorous was present on the surface of the aluminum layer in a relative value of 0.5 to 0.7. Next, a PSG layer covering the surface of the aluminum layer was reactive ion etched with a CHF$_3$, argon, or nitrogen reaction gas, the etching conditions being maintained for some minutes after the completion of the etching of the PSG layer. Phosphorous was present on the surface of the aluminum layer in a relative value of 7 to 8. (It should be noted that most practical semiconductor devices are subjected to over etching in order to eliminate, on a metal layer the residue of the PSG layer to be etched.) Then the surfaces of the aluminum layers which were subjected to the above reactive ion etching process were subjected to three types of cleaning treatments. First, the aluminum layer was treated with an aqueous hydrofluoric acid solution. The relative value of phosphorous present on the surface of the aluminum layer was 1 to 1.5. Second, the aluminum layer was subjected to ion etching with an argon gas so as to etch the suface of the aluminum layer. The relative value of phosphorous present on the surface of the aluminum layer was 0.7 to 1.4. Third, the aluminum layer was treated with an aqueous ammonia solution. The relative value of phosphorous present on the surface of the aluminum layer was 0 to 0.2.

Figure 4:
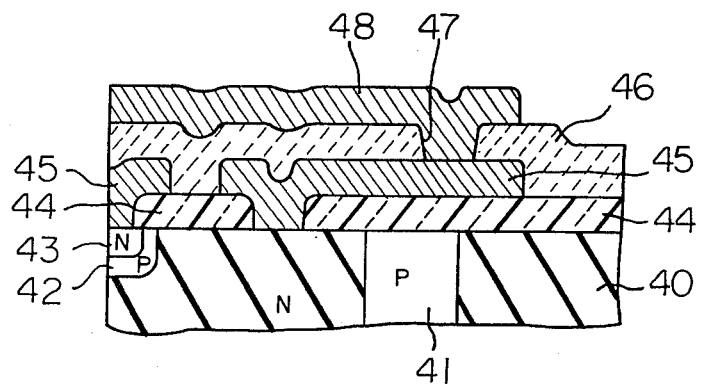
FIG. 4 is a sectional view of a semiconductor device where two metal layers are connected by way of a through hole.

FIG. 4 shows an example of a semiconductor device wherein a bipolar transistor was formed and a connection between two interconnection layers was made by way of a through hole. The bipolar transistor was formed by growing an N-type epitaxial silicon layer 40 on a silicon substrate (not shown in FIG. 4) having a diffused N+-type buried layer (not shown in FIG. 4) and by carrying out P+-type, P-type, and N-type diffusion to form an isolation region 41, a base 42, and an emitter 43, respectively. The surface of the epitaxial layer 40 was covered with a silicon dioxide layer 44. After opening windows in the silicon dioxide layer 44 to form electrodes, first aluminum layer 45, approximately 1 μm thick, was deposited on the silicon dioxide layer 44 and in the windows and was patterned so as to make a first interconnection line. A PSG layer 46, having a thickness of 1 to 2 μm, was formed on the aluminum layer 45 and the silicon dioxide layer 44. A through hole 47 was then opened in the PSG layer 46 by parallel plane-type plasma etching, using carbon tetrafluoride and oxygen as reaction gases, under a pressure of 0.8 Torr. By dry etching, the through hole 47, having a diameter of 3 μm in the PSG layer 46, could be precisely formed, but a phosphorous residue was present on the surface of the aluminum layer 45 and at the bottom of the through hole 47.

Then the surface of the aluminum layer 45 at the bottom of the through hole 47 was cleaned with an aqueous ammonia solution to remove the phosphorous residue from the through hole 47. The chemical reaction which occurred was similar to that described previously. After removal of the phosphorous residue, a second aluminum layer 48 was deposited on the silicon dioxide layer 44 and in the through hole 47. The electrical connection between the first and second aluminum layers was excellent and reliable and there was no contact failure. In comparison, connections similarly made but in which the surface of the first aluminum layer 45 at the bottom of the through hole 47 was not cleaned with an aqueous ammonia solution sometimes resulted in contact failure with the passage of time.

It will be understood by those skilled in the art that the advantages of the present invention also exist when the type of dry etching is a reactive sputter etching as well as and the metal to be cleaned is an aluminum-based alloy, molybdenum, a molybdenum-based alloy, tungsten, a tungsten-based alloy, titanium, a titanium-based alloy, niobium, or a niobium-based alloy and that the foregoing and other changes in form and in detail may be made therein without departing from the spirit and scope of the present invention.

I claim:

1. A process for fabricating a semiconductor device having a semiconductor substrate, comprising the steps of:
    (a) forming a metal layer on the semiconductor substrate;
    (b) forming a phosphosilicate glass layer on the metal layer;
    (c) dry etching a part of the phosphosilicate glass layer to expose a portion of the metal layer; and
    (d) treating the exposed portion of the metal layer with an alkaline solution.

2. A process according to claim 1, wherein said dry etching step (c) comprises selecting the dry etching method from the group consisting of parallel plane-type plasma etching, ion etching and sputter etching.

3. A process according to claim 1, wherein said step (a) comprises the step of forming the metal layer from a metal selected from the group consisting of aluminum, aluminum-based alloy, molybdenum, molybdenum-based alloy, tungsten, tungsten-based alloy, tantalum, tantalum-based alloy, titanium, titanium-based alloy, niobium and niobium-based alloy.

4. A process according to claim 1, wherein said step (d) comprises treating the exposed surface of the metal layer with an alkaline solution selected from the group of solutions consisting of ammonia, organic amines and salts of organic amines.

5. A process according to claim 2, wherein said step (a) comprises the step of forming the metal layer from a metal selected from the group consisting of aluminum, aluminum-based alloy, molybdenum, molybdenum-based alloy, tungsten, tungsten-based alloy, tantalum, tantalum-based alloy, titanium, titanium-based alloy, niobium and niobium-based alloy.

6. A process according to claim 5, wherein said step (d) comprises treating the exposed surface of the metal layer with an alkaline solution selected from the group of solutions consisting of ammonia, organic amines and salts of organic amines.

7. A process according to claim 6, wherein said step (d) comprises treating the exposed surface of the metal layer for approximately 30 seconds.

8. A process according to claim 1, wherein said step (d) comprises treating the exposed surface of the metal layer for approximately 30 seconds.

* * * * *

UNITED STATES PATENT AND TRADEMARK OFFICE
CERTIFICATE OF CORRECTION

PATENT NO. : 4,430,152
DATED : FEBRUARY 7, 1984
INVENTOR(S) : TAKASHI OKANO

It is certified that error appears in the above-identified patent and that said Letters Patent is hereby corrected as shown below:

FRONT PAGE [56] References Cited
line 2, "156/651X" should be --156/651xR--.

Col. 2, line 41, "($H_2N.C_3H_7$)" should be --($H_2N \cdot C_3H_7$)--;

line 45, "($Et_3N+HCHl-$)" should be --($Et_3N+HCl-$)--;

line 47, "($H_2N-.C_3H_7HCl-$)" should be

--($H_2N+ \cdot C_3H_7HCl-$)--.

Col. 3, line 20, "PSG" should be --A PSG--;
line 21, after "as" insert --a--.

Col. 4, line 13, "aluminun" should be --aluminum--;
line 24, "a" should be --an--;
line 40, "FIrst" should be --First--.

Col. 5, line 28, delete "a";
line 29, delete "well as".

Signed and Sealed this

Eighth Day of May 1984

[SEAL]

Attest:

GERALD J. MOSSINGHOFF

Attesting Officer     Commissioner of Patents and Trademarks